United States Patent [19]

Hollister

[11] Patent Number: 4,755,951
[45] Date of Patent: Jul. 5, 1988

[54] METHOD AND APPARATUS FOR DIGITIZING A WAVEFORM

[75] Inventor: Allen L. Hollister, Beaverton, Oreg.

[73] Assignee: Tektronix, Inc., Beaverton, Oreg.

[21] Appl. No.: 835,582

[22] Filed: Mar. 3, 1986

[51] Int. Cl.$^4$ .................. G01R 23/16; H03K 13/02
[52] U.S. Cl. ..................... 364/487; 340/347 AD; 328/13; 328/28; 364/571
[58] Field of Search .................. 364/486, 487, 571; 328/13, 14, 28; 340/347 AD, 347 M

[56] References Cited

U.S. PATENT DOCUMENTS

| | | | |
|---|---|---|---|
| 4,473,797 | 9/1984 | Shiota | 364/571 |
| 4,490,713 | 12/1984 | Mrozowski et al. | 340/347 AD |
| 4,494,212 | 1/1985 | Muellner | 364/571 |
| 4,517,550 | 5/1985 | Nakamura et al. | 364/571 |
| 4,527,148 | 7/1985 | Kuboki et al. | 340/347 M |
| 4,616,329 | 10/1986 | Abrams et al. | 340/347 AD |
| 4,641,246 | 2/1987 | Halbert et al. | 364/487 |

FOREIGN PATENT DOCUMENTS 60-176174  9/1985  Japan ..................... 364/487

OTHER PUBLICATIONS

Sapankevych et al, "Measurement Computer Eases Waveform Analysis", from *Electronics*, vol. 54, No. 19, Sep. 22, 1981, pp. 113–120.

*Primary Examiner*—Parshotam S. Lall
*Assistant Examiner*—Brian M. Mattson
*Attorney, Agent, or Firm*—Daniel J. Bedell

[57] ABSTRACT

A waveform digitizer includes a sampling bridge for producing a sequence of analog samples of an input waveform, the samples being calibrated by an amplifier having adjustable offset and gain and then converted to digital quantities for storage in an addressable memory. The digitizer also includes memory and time base control circuits permitting real and equivalent time sampling of repetitive waveforms and logic circuits providing hardware averaging of multiple data samples.

7 Claims, 7 Drawing Sheets

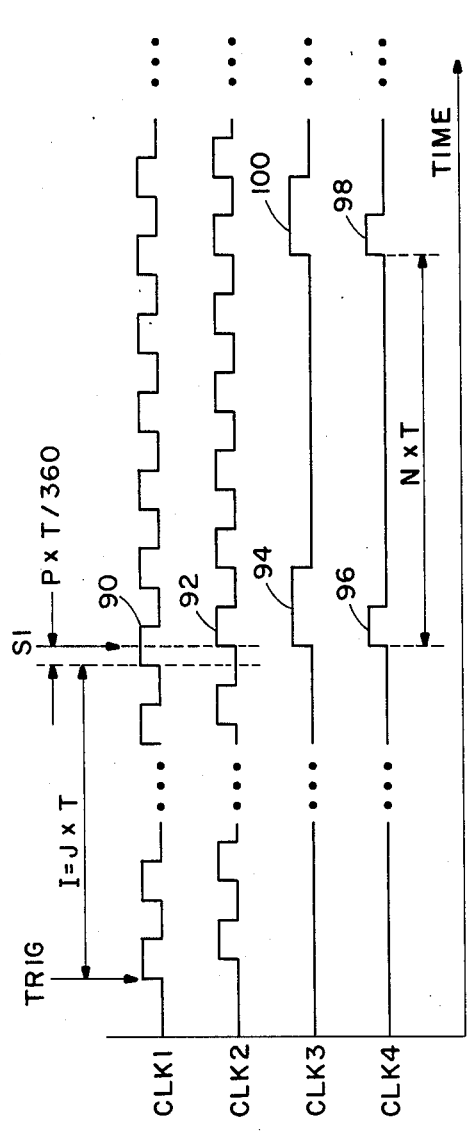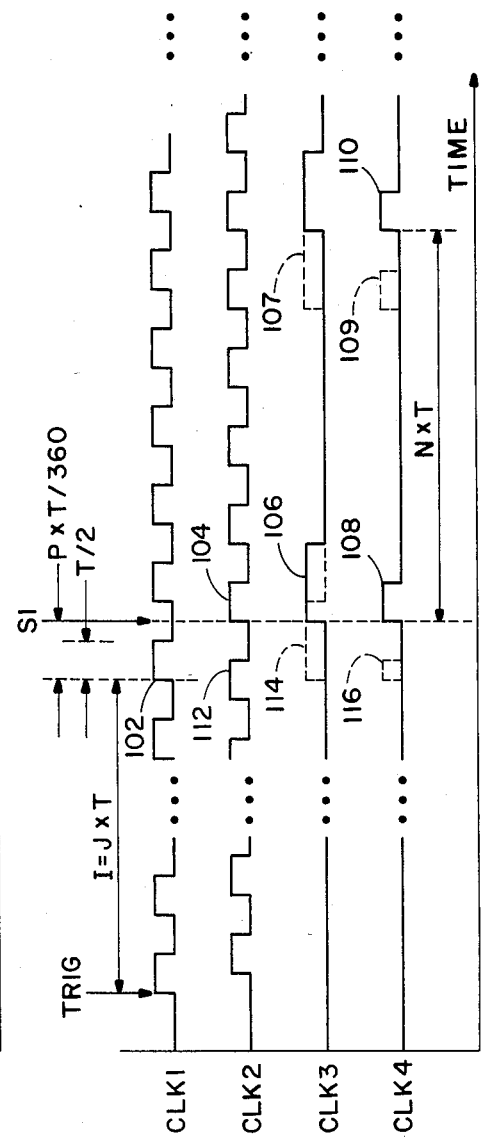

METHOD AND APPARATUS FOR DIGITIZING A WAVEFORM

BACKGROUND OF THE INVENTION

The present invention relates in general to a method and apparatus for digitizing an analog waveform and more particularly to a waveform digitizer providing hardware averaging and autocalibration of waveform samples.

Sampling oscilloscopes were developed more than twenty years ago to respond to small, fast-changing signals to which conventional oscilloscopes could not respond due to limited bandwidth or risetime characteristics. Sampling is a now well-known technique wherein a signal path is gated for an extremely short period of time to pass the substantially instantaneous amplitude value (voltage sample) of an electrical signal during that period. Each sample taken in this manner is processed by electronic circuits and displayed as a dot on a cathode-ray tube (CRT) display, the dot being horizontally positioned according to sample time and vertically positioned according to sample magnitude. Since a large number of samples are required to accurately reconstruct a waveform, sampling is most practical when the electrical signal is repetitive in nature since in most cases it is impossible to acquire all of the needed samples during a single event or single cycle of the signal. Indeed, one of the advantages of sampling is that at least one sample can be acquired from each of a large number of cycles, and a representative waveform may be reconstructed therefrom.

Sampling modes are typified in accordance with the timing method used. Sequential sampling is a mode in which the display is comprised of a very orderly series of equally spaced dots. Random sampling is a mode in which successive dots may occur at what appear to be random horizontal positions because the sampling timing and signal triggering are unrelated, although it must be pointed out that with random sampling the reconstructed waveform is defined because the dots are inserted into the display at substantially correct time positions.

Prior art sampling systems, referred to herein as classic samplers, include a high-speed sampling gate, a sampling capacitor, a memory gate, a memory capacitor, associated amplifiers including a sampling preamplifier and a memory amplifier, and a feedback attenuator from the memory amplifier output to the sampling preamplifier input. A sampling loop is formed having a forward gain from input to output and a feedback attenuation factor from output to input to establish a loop gain which is ideally unity. The purpose of the feedback amplifier is to place a voltage on the sampling capacitor which is equal (for unity loop gain) to the last sample taken as an estimator of the next sample to be taken. With each sample, the memory output repeatedly attempts to reduce to zero the voltage existing between the input and output of the sampling gate. If the input voltage is the same each time it is sampled, the feedback matches it, reducing the difference and the size of each amplified step to practically zero. The ability of a sampling oscilloscope to display correctly the voltage change between any two successive samples is known as a dot transient response, and good dot transient response requires unity loop gain.

There are situations in which it is desirable to have a loop gain which is not equal to one. For example, in a process known as smoothing, i.e., reducing the effect of random noise or jitter in the display, the loop gain is set to some value less than one. However, smoothing results in a degraded dot transient response, since the estimator placed on the sampling capacitor is derived from the previous sample and may be different from the new sample about to be taken. The viewed reconstructed waveform has the appearance of having been passed through a low-pass filter, and while noise is reduced on the displayed waveform, the input signal is distorted. Moreover, signal noise is not completely eliminated, but rather is distributed along the displayed waveform.

SUMMARY OF THE INVENTION

In accordance with one aspect of the invention, a waveform digitizer includes a high efficiency sampling bridge for producing analog samples of an input waveform. The samples are amplified by an amplifier having an adjustable gain and offset, and the output of the amplifier is converted by an analog-to-digital converter to proportional digital values which are then stored in an addressable memory. The use of the high efficiency sampling bridge eliminates the need for a sampling capacitor precharged by a feedback estimator, thereby eliminating problems due to capacitor droop and feedback inaccuracies associated with classic samplers of the prior art. The adjustable amplifier offset and gain permit sample data to be hardware calibrated "on the fly" to account for any offsets or losses inherent in the digitizer so that the data stored in memory, accurately represents the sampled waveform without further correction.

In accordance with another aspect of the invention, the digitizer also includes a predictive time-base circuit which permits waveform sampling at precisely controlled time intervals following triggering events in repetitive sections of the waveform. The digitizer further includes a circuit for addressing the memory so that successive sample data are sequentially stored in memory at predetermined memory address increments. The predictive time-base and memory control circuits permit the digitizer to operate in an equivalent time mode wherein the waveform is characterized by samples taken during more than one waveform period, thereby allowing accurate digitization of high frequency waveforms.

In accordance with a further aspect of the invention, the sampling system also includes hardware for dividing each digital quantity by a selected amount and for adding the divided digital quantity to data previously stored in memory. This feature of the invention permits rapid hardware averaging of samples taken at similar time points during repetitive sections of a waveform. The hardware averaging of samples reduces the effects of noise in any one sample without affecting the digitized representation of any other point on the waveform.

In accordance with yet another aspect of the invention, the waveform digitizer provides for digitizing repetitive waveforms in an enhanced accuracy mode wherein a waveform sample is initially digitized to the resolution limits of the analog-to-digital converter and then stored in the memory. The amplifier offset is then adjusted according to the magnitude of the initial sample data stored in memory and the amplifier gain is increased such that when the waveform is sampled again at a similar point during a subsequent waveform section, the magnitude difference between the new waveform sample and the lower resolution stored data is amplified and digitized. The amplified difference is divided and the result is then added as lower order bits to the lower resolution stored data to produce a higher resolution and higher accuracy representation of the waveform sample.

It is accordingly an object of the invention to provide a high-speed waveform digitizer in which high frequency waveforms are accurately digitized.

It is another object of the invention to provide a waveform digitizer providing high-speed hardware averaging of repetitive samples thereby reducing the effects of noise on an input waveform.

It is a further object of the invention to provide a waveform digitizer wherein sample data is rapidly calibrated as it is acquired.

It is yet another object of the invention to provide a sampling system wherein waveforms may be digitized with enhanced resolution and accuracy.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIGS. 7 and 8 are timing diagrams sharing timing relationships between signals of FIG. 6;

DETAILED DESCRIPTION

Figure 1:
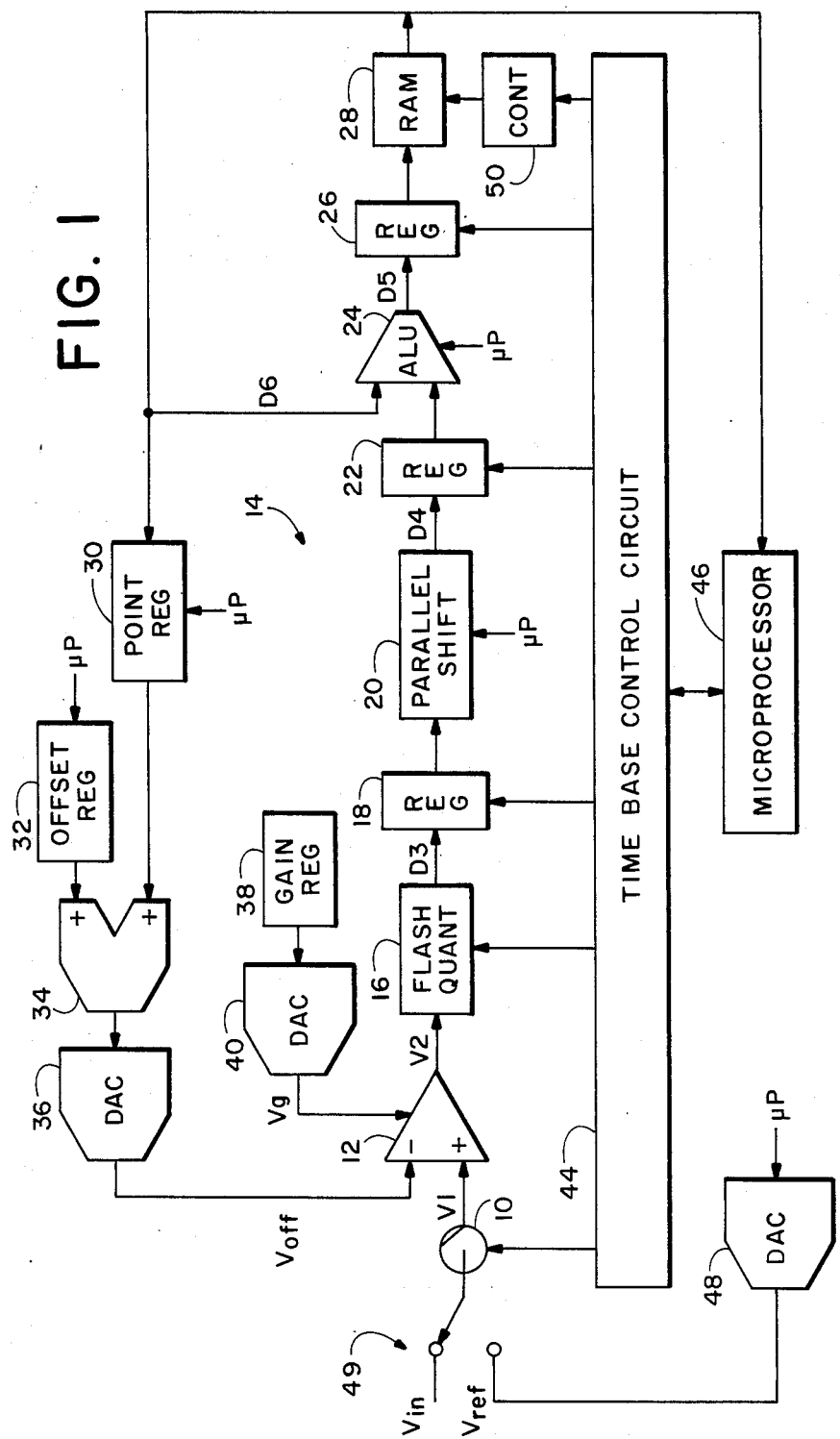
FIG. 1 is a block diagram of a waveform digitizer according to the present invention.

Referring to FIG. 1, there is depicted in block diagram form a waveform digitizer according to the present invention adapted to sample and digitize an input waveform Vin. The digitizer includes a high efficiency sampling bridge 10, for repeatedly sampling waveform Vin to produce a first sequence of output voltages V1, each voltage V1 having a magnitude substantially equal to the instantaneous magnitude of the input waveform. Each sample voltage V1 output of the sampling bridge 10 is applied to a non-inverting input of an amplifier 12, while an offset voltage Voff is applied to an inverting input of the amplifier. Amplifier 12 has an adjustable gain set according to an applied gain control voltage Vg. The output of amplifier 12 thus comprises a second sequence of voltages V2, each voltage V2 of a magnitude related to the magnitude of a corresponding voltage V1 of the first sequence by an adjustable offset voltage and an adjustable gain. Each voltage V2 is applied as an input to a digital pipeline 14 comprising a flash quantizer 16, registers 18, 22 and 26, a parallel shifter 20, and an arithmetic logic unit 24. Flash quantizer 16 is an analog-to-digital converter adapted to convert the second sequence of voltage V2 into a third sequence of digital data D3, each data D3 comprising a 10-bit digital quantity representing the magnitude corresponding to one of the voltages V2 of the second sequence.

Each D3 data output of flash quantizer 16 is stored in register 18 and applied as input to parallel shifter 20 which produces an output having the same bit pattern as its input but shifted by a selected number (n) of bits such that the parallel shifter 20 input binary number is divided by a factor of $2^n$. The output of parallel shifter 20 in response to the third sequence of data D3 therefore comprises a fourth sequence of digital data D4 wherein each data D4 represents a magnitude which is an adjustable fraction of the magnitude of a corresponding data D3 of the third sequence. Each data output D4 of parallel shifter 20 is temporarily stored in register 22 and then transmitted to an input of arithmetic logic unit (ALU) 24. ALU 24 may be set to produce a fifth sequence of data D5, each data D5 having a magnitude equal to the sum of corresponding data D4 of the fourth sequence and other data D6 applied to a second input of the ALU. The ALU 24 can also be set such that it does not add the second input data D6 to the data of the D4 sequence. In such case, each data D5 of the fifth sequence has the same value as corresponding data D4 of the fourth sequence. Each data D5 of the fifth sequence is stored in register 26 and then transmitted to data input terminals of a random access acquisition memory 28.

Currently addressed data in acquisition memory 28 is applied as the second input data D6 of ALU 24 and also to an input of a "point" register 30. The contents of point register 30 and the contents of an "offset" register 32 are summed by an adder 34 and the sum is converted to a proportional analog quantity by a 16-bit digital-to-analog converter (DAC) 36. The analog quantity is then applied as the offset voltage Voff to the inverting input of amplifier 12. The gain of amplifier 12 is adjusted by modifying data stored in a gain control register 38, the contents of which are converted by a 10-bit DAC 40 into the Vg signal which controls the gain of amplifier 12. The digitizer is calibrated by adjusting the offset and gain voltages Voff and Vg as described hereinbelow.

The sample timing of sampling bridge 10 is controlled by a strobe signal from a time base control circuit 44. Circuit 44 also controls the timing of flash quantizer 16 and input enables registers 18, 22, and 26. Various operating parameters of the time base control circuit 44, including strobe signal timing, are controlled by data from a microprocessor 46. The amount by which parallel shifter 20 shifts data and the operation mode of ALU 24 are also determined by data provided by microprocessor 46. The addressing and write enabling of memory 28 is provided by a memory control circuit 50 which is clocked according to a timing signal from time base control circuit 44 and which is further controlled by data from microprocessor 46. Microprocessor 46 also provides the offset and gain control data stored in registers 32 and 38 and controls the input enabling of registers 30, 32 and 38.

Another 16-bit DAC 48 is provided for converting data from microprocessor 46 into a reference voltage Vref which is applied through a switch 49 to sampling bridge 10 in lieu of the Vin input for calibrating the digitizer. The digitizer 10 is calibrated by first applying a DC voltage of zero magnitude from DAC 48 as the input to sampling bridge 10. The zero volt sample is then offset and amplified by amplifier 12, digitized by flash quantizer 16, transmitted through pipeline 14, and stored in memory 28. The data stored in memory 28 is then read by microprocessor 46. With the ALU 24 set so that it does not add data D6 to data D4, the data D5 representing the reference voltage will have a non-zero magnitude if Voff is not properly adjusted. The microprocessor 46 reads this data from memory 28 and increases or decreases the magnitude of data stored in offset register 32 by an amount proportional to acquired data. If the data is less than (or greater than) zero, the microprocessor decreases (or increases) the magnitude of data stored in offset register 32. The change in offset register 32 causes a change in the Voff output of DAC 36 which tends to cancel the effects of any offset in the system. The process may be repeated with the gain of amplifier 12 set to higher levels to insure that the data stored in memory 28 is zero to a high degree of accuracy.

The input Vref to bridge 10 from DAC 48 is then changed to another known value, for instance to one volt, and is again sampled, digitized and stored in memory 28. Any deviation of the stored data from a digital representation of one volt indicates that the gain of amplifier 12 is improperly adjusted and the microprocessor 46 adjusts the data in register 38 to increase or decrease the gain control output Vg of DAC 40 as necessary. The process may be repeated for linear gain adjustments until data stored in memory 28 is correct.

With the system calibrated, the stored waveform data accurately reflects the magnitude of the waveform. In classic sampling systems of the prior art, the digital waveform data stored in memory typically is adjusted by software routines following data storage and is not hardware calibrated prior to storage in memory. The additional processing time required to adjust the acquired data for inherent offsets and gains in the sampling system delays subsequent use of the data, for instance in controlling a waveform display.

The digitizer may be operated in any of several sampling modes. In a "real time" mode of digitzer operation, the sampling bridge 10 samples the waveform Vin several times at regular intervals during one section of a Vin waveform. Each time the sampling bridge 10 samples the Vin input waveform, the analog sample V1 is transmitted to amplifier 12 which offsets V1 by Voff and amplifies the result to produce amplifier output voltage V2. Flash quantizer 16 converts the amplifier output V2 to digital data D3 which is then stored in register 18. Parallel shifter 20 operation is preset by microprocessor 46 such that input data from register 18 is passed to register 22 without a bit shift. The operation of ALU 24 is also set by microprocessor 46 such that ALU 24 passes the D4 data from register 22 to register 26 as data D5 without addition of data D6. The D5 data in register 26 is then stored in memory 28. The current address of memory 28 is incremented by memory control circuit 50 each time data is stored in memory 28 so that waveform data of sequence D5 is stored at successive addresses in memory 28. Since the waveform samples were acquired at regular intervals, the sampled waveform section can be represented by plotting at regular intervals the magnitude of the data in the order that it is stored in memory 28. The real time mode of operation is appropriate when the input waveform to be sampled is of a low frequency compared to the sampling rate of the system. However for high frequency input waveforms Vin, few samples can be taken during a single waveform cycle and the representation of the waveform will not have enough sample points to accurately reflect the shape of the waveform.

Figure 2:
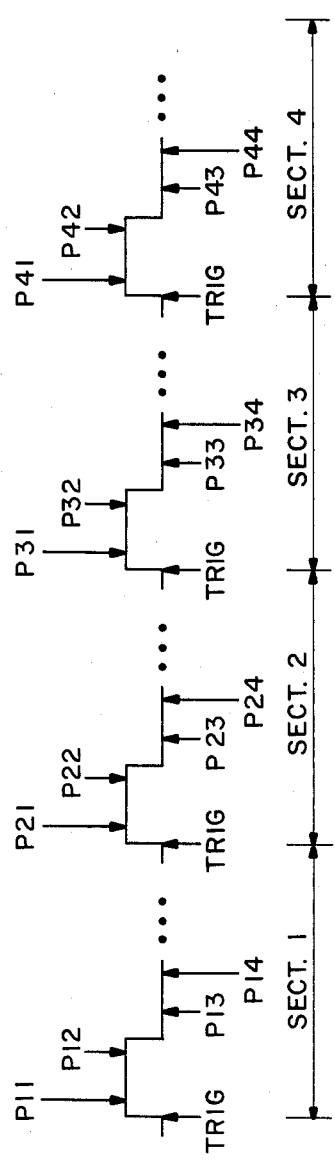
FIG. 2 is an illustration of equivalent time sampling of a waveform according to the present invention.

To sample high frequency signals, the digitizer of the present invention may also be operated in an "equivalent time" mode. In this mode, repetitive Vin waveform sections are sampled one or more times at regular intervals during each waveform section, the sampling times being delayed (skewed) following a similar triggering event in each waveform section by progressively larger amounts. FIG. 2 depicts four such waveform sections. In this example, each section includes one cycle of a high frequency square wave and the triggering event is the leading edge of each square wave cycle. Due to sampling rate limitations, the square wave can be sampled a maximum of only four times during each cycle. The first sample P11 of cycle 1 is taken immediately following the triggering event, and the next three samples P12–P14 are taken at regular, ½ square wave pulse width intervals during the remainder of cycle 1. The first sample P21 of cycle 2 is taken ⅛ of a pulse width after the triggering event and the remaining three samples P21–P24 are taken at ½ pulse width intervals thereafter. In a similar fashion the four samples P31–P34 of cycle 3 are taken at ½ pulse width intervals starting ¼ of a pulse width after the triggering event and the four samples P41–P44 of cycle 4 are taken at ½ pulse width intervals starting ⅜ of a pulse width after the triggering event.

Figure 3:
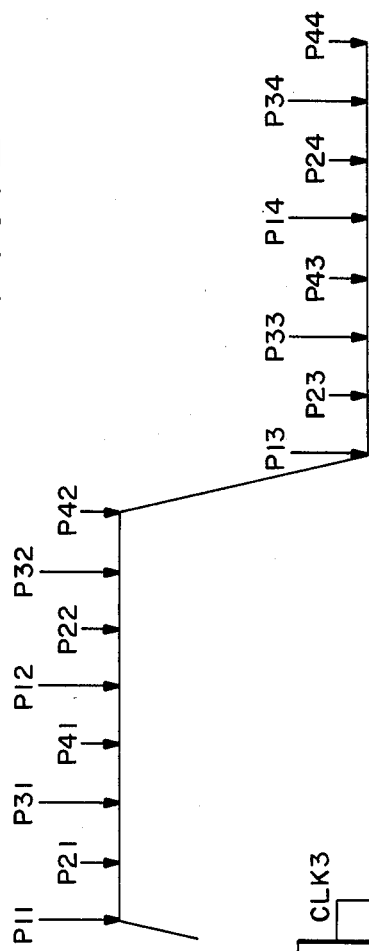
FIG. 3 is an illustration of a waveform representation produced by waveform sample data acquired according to the example of FIG. 2.

The digitized data representing the magnitude of the waveform at P11 is stored at a starting address in memory 28 as selected by data supplied to memory control circuit 50 by microprocessor 46 prior to data acquisition. The memory address is then incremented by four and the data from point P12 is stored. The data representing points P13 and P14 are stored in memory at addresses incremented by eight and twelve, respectively, from the storage address of point P11. The current memory address is then decreased so that the data from point P21 is stored at the next larger memory address after the storage address of P11. The data of points P22–P24 are then stored sequentially with the memory 28 address again being incremented in steps of four. As data from samples P31–P44 are acquired, memory 28 addressing is controlled in a similar manner such that the point data is stored at successive addresses in the following order: P11, P21, P31, P41, ... P14, P24, P34, P44. The repetitive waveform may then be graphically represented as in FIG. 3 by plotting the data magnitudes at regular intervals in the order in which they are stored in memory 28. The sampling interval resolution of the resulting representation is equivalent to the resolution which could be obtained in the real time mode of operation if the waveform were sampled at a rate four times faster. Therefore, given a limited maximum sampling rate, the equivalent time mode of operation permits an improvement in sampling interval resolution over that which can be obtained using the real time mode. The improvement in sampling resolution which can be obtained is limited only by the smallness and accuracy of the skew increments which can be produced by the time base control circuit 44.

The digitizer of the present invention may also be operated in an enhanced accuracy mode wherein the digitization accuracy and resolution may be increased beyond the 10-bit accuracy and resolution of the flash quantizer 16, for example to 12 bits or more, depending on the accuracy of other components of the digitizer.

Initially, sample data is acquired, digitized to 10-bit resolution and accuracy, and stored in memory 28 using the real time or equivalent time modes described hereinabove. A subsequent section of the waveform is then sampled at similar points, but before each sample is taken, point reoister 30 is loaded with the sample data in memory 28 acquired at a corresponding point along a previous section of the waveform. The point data in register 30 is added to the offset data in offset register 32 by adder 34 thereby increasing the offset voltage output of DAC 36 applied to the inverting input of amplifier 12. Thus in addition to offsetting the input voltage by an amount necessary to calibrate the digitizer, the amplifier 12 offsets the incoming sample voltage V1 by the analog equivalent of the previously acquired 10-bit data stored in memory 28 and amplifies the result. Prior to the second sampling process, the data in gain control register 38 is changed by microprocessor 46 so that the gain of amplifier 12 is increased by a factor of, for instance, 256 and parallel shifter 20 is adjusted to shift incoming data by eight bits to divide the data by 256. ALU 24 is set to add incoming data D4 from register 22 to the previously acquired 10-bit point data D6 stored in memory 28 to produce a result which more accurately reflects the magnitude of the input voltage.

The amplified difference output V2 of amplifier 12 is thus quantized to 10-bit accuracy by flash quantizer 16, shifted eight bits by parallel shifter 20, and added by ALU 24 to the 10-bit data D6 previously stored in memory 28. Assuming the ALU 24 is sized to provide a 12-bit output, the 12-bit accurate output is then passed through register 26 and stored in memory 28, replacing the previously stored 10-bit accurate data. This improved accuracy method may be also utilized when calibrating the system When a waveform contains high frequency noise, a sampling system may sample a noise peak and the resulting picture of the waveform reconstructed from the sample data can be grossly distorted. Classic samplers of the prior art typically employ a technique called "smoothing" to distribute the effects of a noise pulse over a wider portion of the waveform representation. However, smoothing reduces the transient response of the system and a waveform reconstructed from the acquired data appears to have been distorted by a low pass filter. For instance, a square-wave input would result in a representation wherein the leading and trailing edges would appear rounded. To reduce the effects of transients on the input waveform, the sampling system of FIG. 1 may be operated in one of several averaging modes wherein a repetitive waveform is sampled at similar sample points during several repetitive waveform sections. The digitized result of each sample is then divided by the number of samples taken, and the divided results for all samples are summed and stored in memory 28.

By taking a large number of samples at similar points along repeated sections of a waveform and finding the average sample value for each point, the effect of a noise spike occurring during any one sample is greatly reduced. For instance, if 1024 repetitive waveform sections are to be sampled, parallel shifter 20 is set to shift incoming data by 10 bits, thereby dividing the incoming sample data by 1024. The ALU 24 adds this divided data to data previously stored in the memory 28 location corresponding to the sample point and the data at this memory location is then replaced by the sum. After 1024 samples have been taken for each different sampling point, the resulting sum stored at each location in memory 28 comprises the average value of the 1024 samples taken at the same point within each of 1024 repetitive waveform sections. The use of averaging reduces the effects of noise and random-occurring transients on an input signal without reducing the ability of the system to accurately digitize steady-state high frequency signals.

One averaging mode of digitizer operation, the "spin" mode, combines equivalent time sampling with hardware averaging. The input waveform is sampled only once at the same relative location with respect to the triggering event during each repetitive waveform section. The current address of memory 28 remains unghanged until, for instance, 1024 samples are acquired, divided, summed, and stored at the current memory address. The current address of memory 28 is then incremented by one and another 1024 repetitive waveform sections are each sampled once. However the sampling time for the second group of 1024 samples with respect to a triggering event within each waveform section is delayed from the sampling time of the first group of 1024 samples by a selected time period. The second group of 1024 data samples are also divided, summed and stored at the incremented memory address. The process is continued for several groups of 1024 sample points, each successive group of 1024 samples being progressively delayed with respect to a triggering event so that the resulting data stored in memory 28 represents a set of average sample values for several points along a waveform section.

In contrast to the spin mode of operation, the digitizer may be operated in a "comb" mode of averaging wherein the input waveform is sampled many times during each of several repetitive waveform sections rather than just once per section. After a sample is taken, the incoming data for the point is digitized, divided and added to data D6 at a current memory 28 address associated with the sampling point. The address of memory 28 is then incremented for the next sample point. The address of memory 28 is reset to an initial address after the sample data from each sampled waveform section is digitized. The process is repeated, for instance, until 1024 waveform sections have each been sampled at several similar points. The resulting data stored in memory 28 thus represents the average of 1024 samples for each of the several points along the waveform section.

A "smooth" mode of averaging combines hardware averaging with real time sampling. The input waveform is sampled at many points during each of several successive sampling intervals along a single waveform section, the address of memory 28 being incremented only after each sampling interval. The data samples taken during each interval are divided and summed to produce a value representing an average of the data points sampled during each interval. The waveform may be reconstructed from this data with the assumption that the average values obtained represent the magnitudes of the waveform at the midpoints of the intervals.

The selection of spin, comb or smooth mode of averaging is based on the frequency of the waveform being digitized. When the digitizer operates in an averaging mode, the microprocessor must provide a new address to memory control circuit 50 each time the memory address must be changed. Therefore, for the comb mode of averaging, the microprocessor must reset the memory address after every sample is taken, while for the spin mode of averaging the microprocessor resets the memory address only after many (for example, 1024) samples are taken. Since the period of high frequency input signals is short compared to the time required for the microprocessor to change the memory address, for high frequency input signals the spin mode of averaging digitizes a waveform more rapidly than the comb mode for the same given number of samples per point. However, the comb mode is faster than the spin mode for lower frequency input signals. The smooth mode of averaging is appropriate only for digitizing very low frequency signals since all the samples are taken during only a single waveform section.

Figure 4:
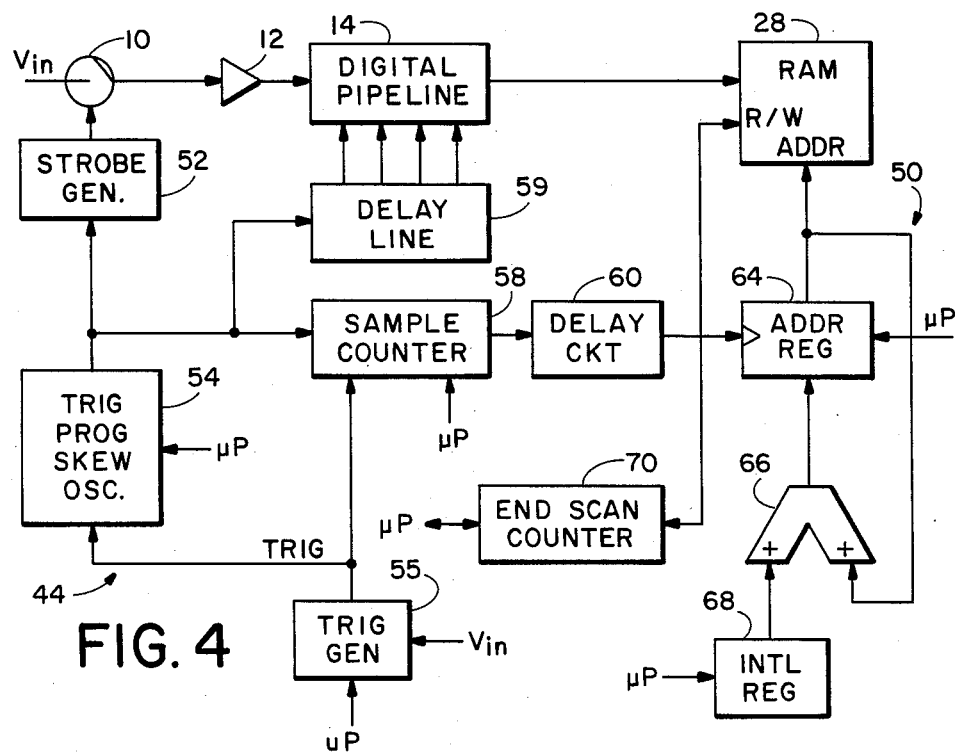
FIG. 4 is a block diagram of the time base circuit and memory control circuits of FIG. 1.

Referring to FIG. 4, the time base control circuit 44 and the memory control circuit 50 of FIG. 1, are depicted in more detailed block diagram form. Sampling bridge 10 of the digitizer samples the Vin input signal when it is strobed with short pulses from a strobe generator 52. Strobe generator 52 produces the strobe pulses in response to a square wave signal from a triggered, programmable skew oscillator 54. The frequency of the square wave output signal of oscillator 54 is determined by data from the microprocessor 46 of FIG. 1. The output signal of the oscillator is triggered by a trigger generator 55 which monitors the Vin signal and transmits a triggering signal to oscillator 54 on detection of a selected triggering event such as a zero crossing in the Vin signal, the nature of the triggering event being defined by the data from microprocessor 46. While the output signal of oscillator 54 is initiated by the triggering signal, it is delayed following the triggering signal by a delay time interval determined according to skew data provided to oscillator 54 by the microprocessor 46. Thus the first sampling point along each repetitive waveform section of the Vin signal occurs at the end of an interval of programmably determined duration following the triggering event. Since the oscillator output is periodic, the remaining sampling points during each waveform section occur at regular intervals thereafter. The sampling control signal output of oscillator 54 is stopped and restarted on each subsequent occurrence of the triggering signal, with restarting being delayed for a programmably determined amount of time.

The sampling control signal output of oscillator 54 is also applied to a multiple tap delay line 59, each successive tap of the delay line providing an enabling signal to a separate device of digital pipeline 14 of FIG. 1, including flash quantizer 16, and registers 18, 22 and 26. The delay times associated with each tap are selected in accordance with the operating speed of each pipeline 14 device to permit the sample data to be properly sequenced through the pipeline. The output of oscillator 54 is also applied to a sample rate counter 58 which counts the oscillator output square wave pulses and outputs a write strobe pulse on occurrence of every Nth square wave pulse. The magnitude of N is set according to data provided to counter 58 by the microprocessor 46 of FIG. 1. The count of counter 58 is reset to zero by the triggering signal from trigger generator 55. Each output pulse of counter 58 is delayed by a delay circuit 60 for a sufficient time to permit the sample data to pass through the digital pipeline 14 to the data input terminals of memory 28. Each delayed counter 58 output pulse is then applied to a read/write control input of memory 28 such that the memory is write enabled on every Nth occurrence of a sampling control signal from oscillator 54. If every sample is to be stored in the memory, then the count limit of counter 58 is set to one. But if only every Nth sample is to be stored, the count limit is set to N. This feature is useful for instance when operating in the previously described enhanced accuracy mode wherein a first waveform sample is taken, digitized, and stored in memory 28 and also in point register 30 thereby increasing the offset voltage Voff when a second sample is taken at a similar point on a subsequent waveform section. Since the sample data is stepped through the digital pipeline 14 on each cycle of the strobe control signal, several cycles of the strobe control signal are required to step sample data from the sampling bridge 12 to memory 28 and since a sample is acquired on each cycle of the strobe signal, several unwanted waveform samples are acquired between the first and second samples. The count limit of counter 58 may be set such that data resulting from these unwanted samples is not stored in memory 28.

Memory control circuit 50 of FIG. 4 includes an address register 64, the contents of which address memory 28. The address data in register 64 is also applied as one input to an adder 66 while data stored in an interleave register 68 is applied as a second input to the adder. The memory write strobe signal from delay line 60 also drives a clocking input of address register 64 so that register 64 stores the output of adder 66 as the next memory address at the end of each write strobe signal. Thus the memory address may be incremented by the value of the data stored in interleave register 68 on each occurrence of a pulse from delay circuit 60. The ability to increment the memory address by a programmable amount enables the digitizer to store data in memory 28 in the right order when operating in an equivalent time mode as described hereinabove and enables the memory address to be changed rapidly after each sample without intervention by microprocessor 46.

The write strobe output signals of delay circuit 60 are also applied to an end-of-scan counter 70 which transmits a signal to the microprocessor when the number of write strobes reaches a limit preset by the microprocessor. This tells the microprocessor that the data acquisition process is complete. Since trigger generator 55 may be selectively enabled or disabled by a signal from microprocessor 46, the microprocessor can enable the trigger generator so that it generates one trigger and then disables it until the end-of-scan counter 70 indicates a predetermined number of samples have been acquired. The microprocessor can then enable the trigger generator again. This feature permits the microprocessor to control the number of samples per repetitive waveform section.

The time base control circuit 44 thus permits predictive sampling operation of the digitizer by accurately controlling the sampling rate, the location of each sample on the waveform with respect to a trigger point the frequency at which sample data is stored in the acquisition memory, and the memory address at which each data point is stored. Microprocessor 46 controls the sample rate by adjusting the output frequency of oscillator 54, and controls the location of the sampling points on the waveform with respect to the trigger signal by adjusting the skew amount of oscillator 54. Microprocessor 46 controls the data storage rate of memory 28 by adjusting the count limit (N) of sample rate counter 58 and controls the addressing steps at which successive data is stored in acquisition memory 28 by adjusting the magnitude of the data stored in interleave register 68. The microprocessor may also directly set the memory address at any time by loading data directly into address register 64 and can control the total number of sample points to be stored following each trigger signal by appropriately programming the end-of-scan counter 70 and controlling trigger generator 55.

Figure 5:
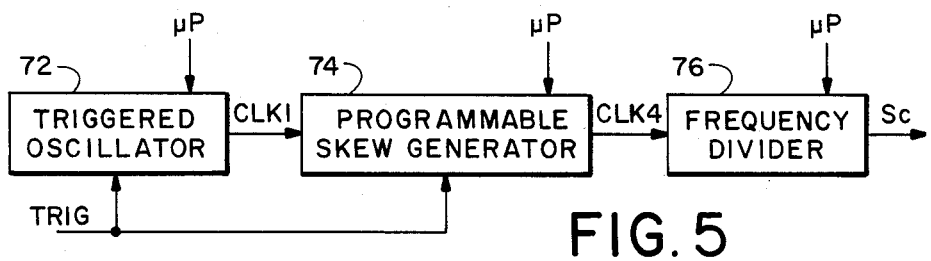
FIG. 5 is a block diagram of the programmable skew triggered oscillator of FIG. 4.

The block components of the memory address generator 50 and of the time base control circuit 44 (other than the triggered, programmable skew oscillator circuit 54) are common devices, well known in the art and are not further detailed herein. Referring to FIG. 5, the oscillator circuit 54, depicted in more detailed block diagram form, includes a triggered oscillator 72, a programmable skew generator 74, and a programmable frequency divider 76. The triggering signal from trigger generator 55 of FIG. 4 is applied to oscillator 72 which initiates a 100 MHz squarewave output signal CLK1 on receipt of the trigger signal. The oscillator 72 output signal is applied to skew generator 74 which initiates a 20 MHz output signal following receipt of the trigger signal, delayed by a programmable delay time. The 20 MHz skew generator output signal CLK2 provides an input to the frequency divider 76 which generates the strobe control signal output to drive the strobe generator 52 of FIG. 4. The frequency of the strobe control output signal is selected by frequency divider 76 which divides the 20 MHz CLK4 input signal from skew generator 74 by an amount determined by data provided by the microprocessor 46 of FIG. 1. Circuits capable of performing the functions of oscillator 72 and frequency divider 76 are well known in the art and are not further detailed herein.

Figure 6:
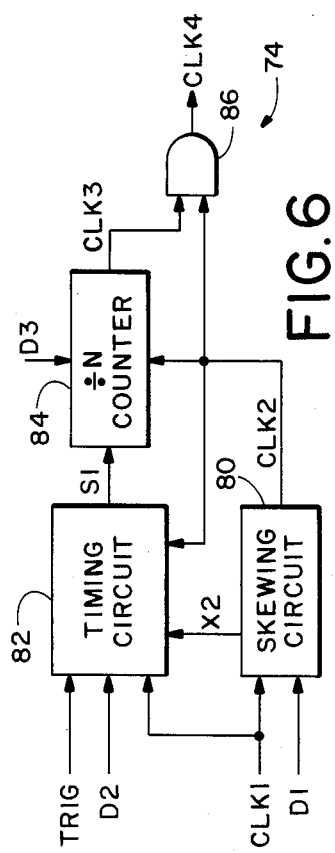
FIG. 6 is a block diagram of the programmable skew generator of FIG. 5.

Referring to FIG. 6 the programmable skew generator 74 of FIG. 5, depicted in more detailed block diagram form, comprises a skewing circuit 80, a timing circuit 82, a divide-by-N counter 84 and an AND gate 86. The skewing circuit 80 generates a square wave output signal CLK2 which is of the same frequency, 100 MHz, as the output signal (CLK1) of the triggered oscillator 72 of FIG. 5, CLK1 being applied as a reference clock to the skewing circuit. While CLK1 and CLK2 are of the same frequency, the skewing circuit output signal CLK2 lags CLK1 by a phase angle ranging from 0 to 360 degrees as determined by applied phase angle data D1 from the microprocessor 46 of FIG. 1.

The reference signal CLK1 is also applied as an input to timing circuit 82 along with the CLK2 signal and the triggering signal TRIG which initiated the reference clock signal CLK1 and which, therefore, coincides with the leading edge of the first pulse of the CLK1 signal. Timing circuit 82 produces an enabling signal S1 on the leading edge of the first CLK2 pulse occurring on the first CLK2 pulse after the end of a predetermined time interval following the triggering signal. The duration of this time interval is determined according to timing data D2 applied as input to the timing circuit 82 from the microprocessor 46 of FIG. 1 and according to the state of a binary control signal X2 produced by the skewing circuit 80, indicating whether the phase shift between CLK1 and CLK2 is greater than 180 degrees. Data D2 indicates a time interval in terms of an integer number J of reference clock CLK1 pulses. Timing circuit 82 adjusts the time interval for delaying S1 either to $J \times T$ seconds or to $(J \times T) + (T/2)$ seconds, where T is the time in seconds of one period of the reference clock signal CLK1. The additional T/2 seconds is added to the interval if the X2 signal indicates that the phase shift between CLK1 and CLK2 exceeds 180 degrees.

The enabling signal S1 count enables the divide-by-N counter 84 which counts pulses of the clock signal CLK2 output of the skewing circuit 80. Counter 84 produces an output pulse of duration T seconds when count enabled and thereafter produces an additional output pulse each time it counts N subsequent pulses of clock signal CLK2, where N is determined according to control data D3 from microprocessor 46. In this application, where the clock signal CLK2 has a 100 MHz frequency and a 20 MHz skew generator output signal is required, N is set to 5 such that the frequency of the output signal CLK3 produced by the divide-by-N counter 84 is 20 MHz. The signals CLK2 and CLK3 are applied as inputs to the AND gate 86 which produces the 20 MHz output clock signal CLK4 of the skew generator.

The timing relationships between CLK1, CLK2, CLK3 and CLK4 when the phase shift P between CLK1 and CLK2 is less than 180 degrees are illustrated m the timing diagram of FIG. 7. When the phase shift P between CLK1 and CLK2 is less than 180 degrees, the X2 signal is of a state wherein the additional T/2 seconds are not included in the time interval I following the triggering signal TRIG. Since the enabling signal S1 occurs on the leading edge of first CLK2 pulse (pulse 92) after the end of interval I, the time interval between TRIG and S1 is therefore $J \times T$ seconds plus an additional amount of time ($P \times T/360$ seconds) due to the phase difference between the leadino edge of the Jth CLK1 pulse 90 and the corresponding CLK2 pulse 92. CLK2 pulse 92 causes the divide-by-N circuit to initiate the first CLK3 pulse 94. The AND gate 86 of FIG. 6 then combines this CLK2 pulse 92 and first CLK3 94 pulse to produce the first CLK4 pulse 96. The next CLK4 pulse 98 is produced N cycles of the CLK2 signal later coincident with the next CLK3 pulse 100. Thus the first CLK4 pulse 96 occurs $(J \times T) + (P \times T/360)$ seconds after the triggering signal TRIG and subsequent CLK4 pulses occur every $N \times T$ seconds thereafter.

The timing relationships between CLK1, CLK2, CLK3 and CLK4 when the phase shift P between CLK1 and CLK2 is greater than 180 degrees are illustrated in the timing diagram of FIG. 8. When the phase shift P between CLK1 and CLK2 is greater than 180 degrees, the state of signal X2 is set such that the time i-tnerval I following the triggering signal TRIG is set to $(T \times J) + (T/2)$ seconds. The enabling signal S1 occurs on the leading edge of the next CLK2 pulse 104, or $(P \times T/360) - (T/2)$ seconds after the end of interval I. This CLK2 pulse 104 causes the divide-by-N circuit to initiate the first CLK3 pulse 106 which the AND gate combines with CLK2 pulse 104 to form the first CLK4 pulse 108. The next CLK4 pulse 110 is produced $N \times T$ seconds later. Thus, as in the case when P is less than 180 degrees, the first CLK4 pulse 108 occurs $J \times T + P \times T/360$ seconds after the triggering signal T and subsequent CLK4 pulses occur every $N \times T$ seconds thereafter. The extra half cycle is introduced into interval I when the phase angle between CLK1 and CLK2 is greater than 180 degrees because without the extra half cycle delay, the CLK2 pulse 112 preceding pulse 104 would prematurely trigger a CLK3 pulse 114 (shown in dotted line) which would in turn cause the AND gate to prematurely produce a CLK4 pulse 116 (also shown in dotted line) of insufficient duration. Subsequent CLK3 and CLK4 pulses 107 and 109 would also occur prematurely.

From FIGS. 7 and 8 it can be seen that regardless of the magnitude of the phase shift between CLK1 and CLK2, the time delay between the triggering signal TRIG and the first CLK4 pulse is $(J \times T) + (P \times T/360)$ seconds and the interval between each subsequent CLK4 pulse is $N \times T$ seconds. Since the magnitude of P, J and N are functions of data D1, D2 and D3 from the microprocessor 46 of FIG. 1, the timing of the first CLK4 pulse and the frequency of occurrence of each CLK4 pulse thereafter are completely predictable and controllable with an accuracy determined primarily by the ability of the skewing circuit 80 to accurately adjust the phase angle P between CLK1 and CLK2.

Figure 9:
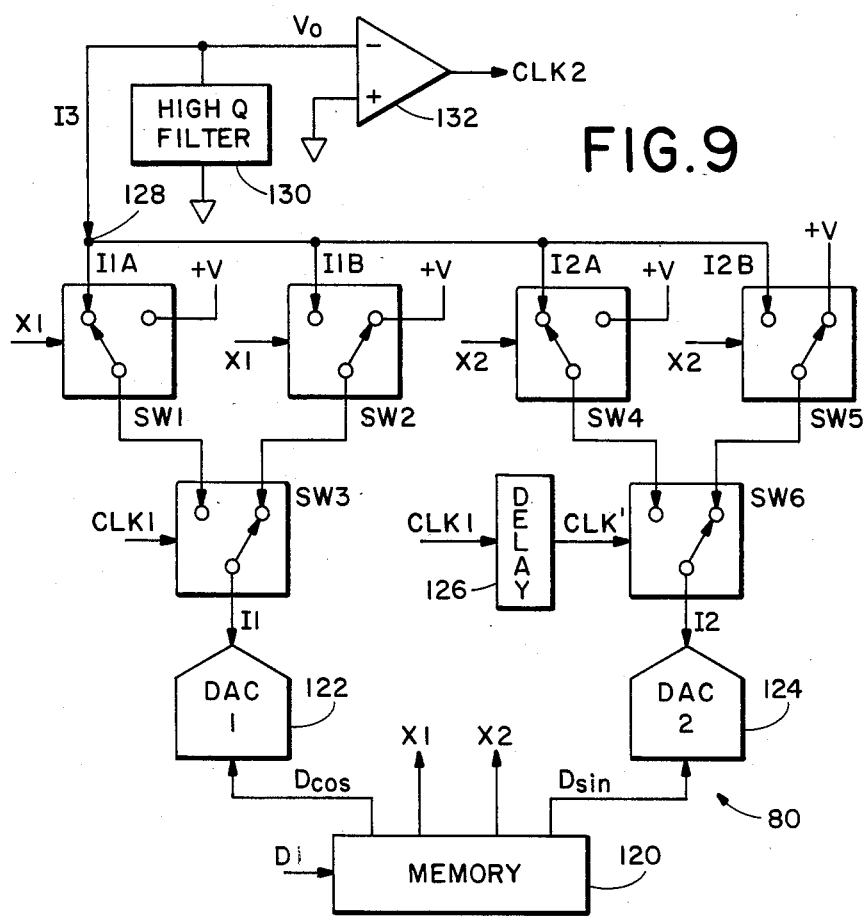
FIG. 9 is a block diagram of the skewing circuit of FIG. 6.

Referring to FIG. 9, the skewing circuit 80 of FIG. 6, depicted in block diagram form, includes a memory 120 addressed by the phase angle data D1. When D1 is set to represent a desired phase angle (from 0 to 360 degrees) between the CLK1 and CLK2 signals, memory 120 outputs data at the addressed storage location corresponding to the desired phase angle, the output data including data D5 and D6 and binary bits X1 and X2. The magnitude of data D5 is proportional to the absolute value of the cosine of the phase angle P indicated by D1, and the magnitude of data D6 is proportional to the absolute value of the sine of the phase angle. Bits X1 and X2 comprise binary control signals which are high or low depending on the magnitude of the corresponding phase angle according to the following Table I:

TABLE I

| Quadrant | Phase Angle | X1 | X2 |
|---|---|---|---|
| First | 0 to 90 | 0 | 0 |
| Second | 90 to 180 | 1 | 0 |
| Third | 180 to 270 | 1 | 1 |
| Fourth | 270 to 360 | 0 | 1 |

It is noted that the X2 signal is high whenever the phase angle exceeds 180 degrees as required for proper operation of the timing circuit 82 of FIG. 6.

The data D5 output of memory 120 is applied as input to a first digital to analog converter 122 which acts as a constant current source, drawing a current I1 of magnitude proportional to the magnitude of D5. Data D6 is applied as the digital input to a second digital to analog converter 124 which also acts as a constant current source, drawing a current I2 of magnitude proportional to the magnitude of D6.

The skewing circuit 80 also includes a set of six electronic switches SW1–SW6. The switching states of switches SW1 and SW2 are controlled by the X1 signal produced by memory 120 and the switching states of switches SW4 and SW5 are controlled by the X2 signal. The switching state of SW3 is controlled by the reference clock signal CLK1 while the switching state of switch SW6 is controlled by an output signal CLK1' of a delay circuit 126 which produces CLK1' by delaying the CLK1 signal by one-fourth of a CLK1 period, or 2.5 nsec for a 10 MHz CLK1 signal. The current I1 of converter 122 drawn from switch SW3 which in turn draws the current from switch SW2 when CLK1 is low and from SW1 when CLK1 is high. The current I2 to converter 124 is provided by switch SW6 which in turn draws current I2 from switch SW5 when CLK1' is low and from switch SW4 when CLK1' is high.

Switch SW1 draws I1 from a node 128 (as a current I1A) when X1 is low and from a source of positive voltage $+V$ when X1 is high, while switch SW2 draws I1 (as a current I1B) from node 128 when X1 is high and from $+V$ when X1 is low. Similarly, switch SW4 draws I2' from node 128 (as current I1C) when X2 is low and when X2 is high, while switch SW5 draws I21 from node 128 (as current I1D) when X2 is high and from $+V$ when X2 is low. A current I3 into node 128 resulting from the combination of I1A, I1B, I2A and I2C currents from node 128 into switches SW1, SW2, SW4, and SW5, is obtained from ground through a 100 MHz, high Q filter 130. The voltage Vo developed across filter 130 as a result of I3 is applied to an inverting input of a comparator 132 while a non-inverting input of the comparator is connected to ground.

Figure 10A:
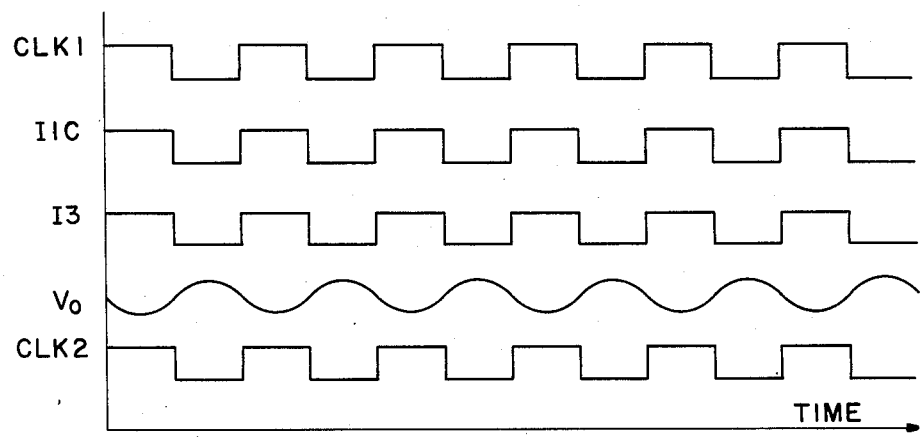
FIGS. 10A-10C are timing diagrams showing timing relationships between signals of FIG. 9.

The operation of skewing circuit 80 is described with reference to FIG. 9 and to the timing diagrams of FIGS. 10A–10C which illustrate the time varying behavior of the relevant signals of FIG. 9 when the desired phase angle between CLK1 and CLK2 is 0, 45 and 315 degrees, respectively. FIG. 10A illustrates the operation of skewing circuit 80 when the phase angle indicated by data D1 is 0 degrees. In such a case, X1 and X2 are both low causing switches SW1 and SW4 to draw I1A and I2A from node 128. The magnitude of data D5 produced by memory 120 is 1, the absolute value of the cosine of 0, and therefore the current I1 has a maximum value, for instance 100 mA. Switch SW3 draws current I1 through switch SW1 during the high state portion of each CLK1 cycle and therefore current I1A appears as a square wave in phase with CLK1. The magnitude of D6, equal to the sine of zero degrees, is 0 and therefore currents I2 and I2A are zero at all times. Thus only current I1A contributes to current I3. The voltage Vo developed across comparator 132 appears as a sine wave oscillating about 0 potential and the resulting comparator output CLK2 is a square wave in phase with CLK1.

Figure 10B:
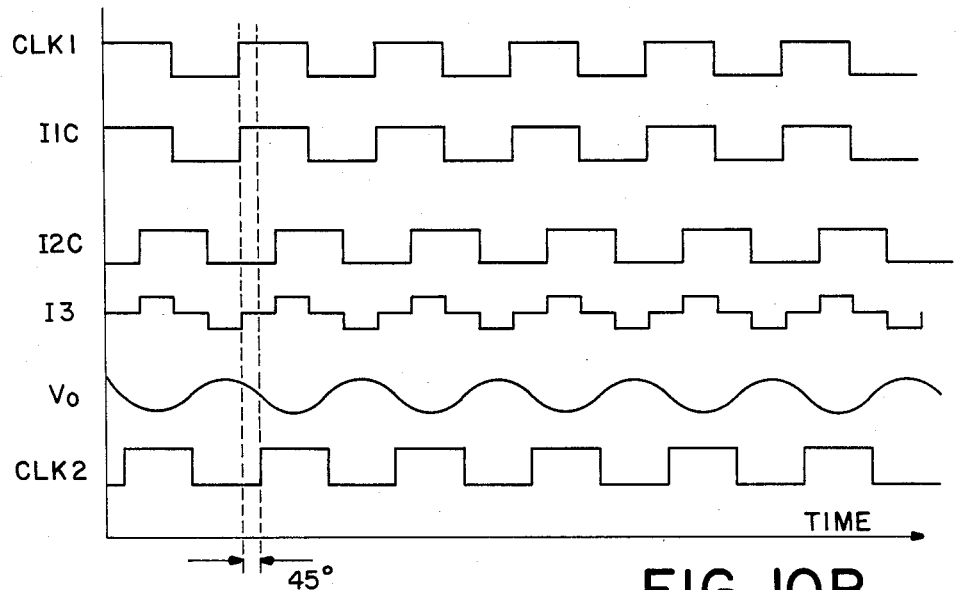

FIG. 10B illustrates the operation of skewing circuit 80 when the phase angle indicated by data D1 is 45 degrees. Again, according to Table I, X1 and X2 are both low such that switches SW1 and SW4 draw I1A and I2A from node 128 and the magnitude of D5 produced by memory 120 is 0.707, the absolute value of the cosine of 45 degrees. Therefore, the current I1 has a magnitude of 0.707 of maximum, for instance 70.7 mA. Switch SW3 draws current I1 through switch SW1 during the high state portion of each CLK1 cycle and therefore current I1A appears as a square wave in phase with CLK1. The magnitude of D6, equal to the sine of 45 degrees, is also 0.707 of maximum. Switch SW6 draws current I2 through switch SW4 during the high state portion of each CLK1' cycle and therefore current I2A appears as a square wave lagging CLK1 by 90 degrees. I2B and I2C are zero at all times. Currents I1A and I2A combine to form current I3, and the sine wave voltage Vo developed across comparator 132 resulting from current I3 is shown in FIG. 10B. Voltage Vo causes comparator 132 to produce a square wave CLK2 output which lags CLK1 by 45 degrees. When the phase angle is another value between 0 and 90 degrees, the operation of the skewing circuit is similar except that the values of currents I1 and I2 differ, with I2 increasing and I1 decreasing as the phase angle is increased from 0. This causes the sine wave Vo to shift to the right as the phase angle indicated by D3 increases, thereby increasing the phase angle between the leading edges of CLK1 and CLK2 pulses.

Figure 10C:
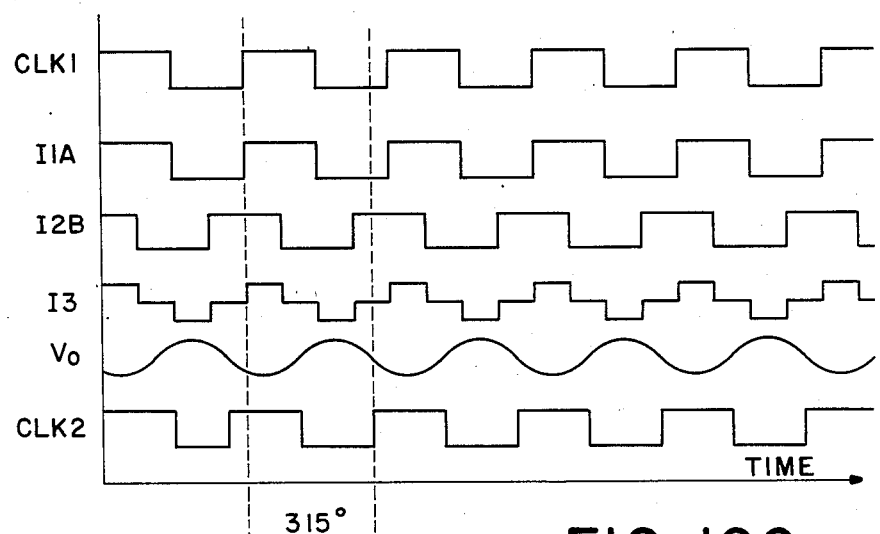

FIG. 10C illustrates the operation of skewing circuit 80 when the phase angle set by data D1 is 315 degrees. According to Table I, X1 is low and X2 is high such that switches SW1 and SW5 draw currents I1A and I2B from node 128. The magnitude of D5 produced by memory 120 is 0.707, i.e., the absolute value of the cosine of 315 degrees, and therefore the current I1 has a magnitude of 0.707 of maximum. Switch SW3 draws current I1 through switch SW1 during the high state portion of each CLK1 cycle and therefore current I1B appears as a square wave in phase with CLK1. The magnitude of D6, equal to the absolute value of the sine of 315 degrees, is also 0.707 of maximum. Switch SW6 draws current I2 through switch SW5 during the low state portion of each CLK1' cycle, and therefore, current I2B appears as a square wave lagging CLK1 by 270 degrees. Currents I1B and I2A are zero at all times. Currents I1A and I2B combine to form current I3. Current I3 and the sine wave voltage Vo developed across comparator 132 resulting from current I3 are shown in FIG. 10C. The voltage Vo causes comparator 132 to produce a square wave CLK2 output which lags CLK1 by 315 degrees.

Thus the skewing circuit 80 permits the phase difference between CLK1 and CLK2 to be adjusted from 0 to 360 degrees. The resolution of the adjustment depends on the resolution of digital to analog converters 122 and 124 and on the size of data D5 and D6 which can be stored in memory 120.

Figure 11:
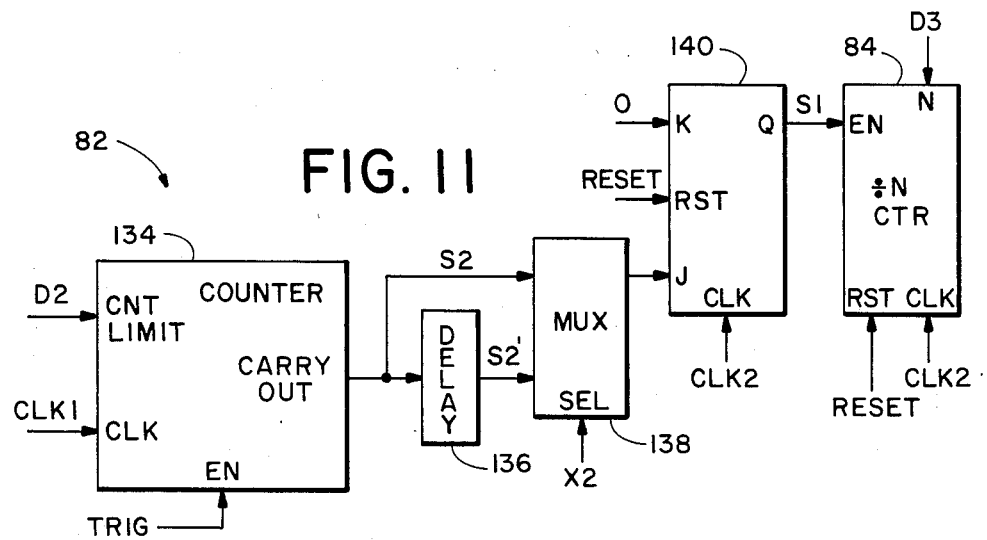
FIG. 11 is a block diagram of the timing circuit of FIG. 6.

Referring to FIG. 11, the timing circuit 82 of FIG. 6, depicted in more detailed block diagram form, comprises a pulse counter 134, a delay circuit 136, a multiplexer 138, and a J-K flip-flop 140. Counter 134 counts pulses of the CLK1 signal applied to a clock input and produces an output signal S2 when the clock pulse count reaches a count limit determined by data D2 applied to a count limit input of counter 134. The counter 134 is enabled by the TRIG signal. The S2 signal is directly applied to one input of the multiplexer 138 and is indirectly applied to another input of the multiplexer through a delay circuit 136 which delays signal S1 by one-fourth of a CLK1 period, or 2.5 nsec for a 100 MHz CLK1 signal. The switching state of multiplexer 138 is controlled by the X2 signal from skewing circuit 80 of FIG. 6 and the output of multiplexer 138, either S2 (when X2 is low) or the output S2' of delay circuit 136 (when X2 is high) is connected to the J input of flip-flop 140. A logic level 0 drives the K input of flip-flop 140 while the CLK2 signal drives the clock input of the flip-flop. The S1 enabling signal is developed at the Q output of the flip-flop and this signal is applied to an enable input of the divide-by-N counter 84.

After the TRIG signal enables counter 134, the counter begins counting CLK1 pulses until the count limit J determined by data D2 is reached. At this point the counter produces the S2 signal which is passed either directly or in delayed form S2' to the J input of flip-flop 140 via multiplexor 138, thereby setting the Q output of flip-flop 140 on the next CLK2 pulse to produce the S1 enabling signal. When signal generation is complete, the flip-flop 140 and divide-by-N counter 84 are reset by a reset signal from the microprocessor.

Thus as described hereinabove the waveform digitizer of the present invention, utilizing a predictive time base circuit to control the timing of data sampling and storage, may be operated to provide real or equivalent time sampling and may be operated in an enhanced accuracy mode and/or in any of three hardware averaging modes. The combination of hardware calibration and hardware averaging enables the digitizer to accurately and rapidly digitize waveforms over a wide range of frequencies with a high degree of noise rejection and resolution.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. An apparatus for digitizing a waveform, comprising:
    means for producing a first sequence of analog samples of an input waveform;
    an amplifier having adjustable offset and gain, said first sequence of analog samples being applied as an input to said amplifier, said amplifier thereby producing a second sequence of analog samples, each sample of the second sequence being related to a corresponding sample of the first sequence according to said adjustable amplifier offset and gain;
    means for converting said second sequence of analog samples into a third sequence of digital data, said amplifier offset and gain being adjusted such that each data of the third sequence represents a magnitude of a corresponding analog sample of the second sequence;
    means for dividing each data of the third sequence by a programmable amount, thereby producing a fourth sequence of digital data, each data of the fourth sequence having a magnitude equal to a programmably determined fraction of magnitude of a corresponding data of the third sequence;
    an addressable memory for storing data;
    means for adding each data of the fourth sequence to a corresponding data stored in said memory, thereby producing a fifth sequence of digital data wherein each data of the fifth sequence comprises a sum of corresponding data of the fourth sequence and corresponding data stored in said memory; and
    means for addressing and write enabling said addressable memory such that data of said fifth sequence is stored in said memory replacing the corresponding data previously stored in said memory.

2. The apparatus according to claim 1 further comprising means for increasing the amplifier offset by an amount proportional to data stored in said memory.

3. An apparatus for digitizing an analog waveform comprising:
    means for periodically sampling the waveform to provide a first sequence of analog waveform samples;
    means for generating an analog offset signal of adjustable magnitude in accordance with digital input data;
    means for amplifying with adjustable gain a magnitude difference between each of said analog waveform samples and said analog offset signal to produce a second sequence of analog output values;

means for producing a plurality of digital quantities, each digital quantity representing a magnitude of a corresponding one of the analog output values of said second sequence;

means for dividing each digital quantity of said third sequence of digital quantities to produce a fourth sequence of divided digital quantities;

means for adding each said divided digital quantity of said fourth sequence to a second digital quantity to produce a digital sum sequence; and addressable memory means for storing said digital sum sequence.

4. The apparatus of claim 3 wherein said means for dividing comprises a parallel shifter.

5. A method for digitizing a waveform having repetitive sections comprising the steps of:

generating a plurality of trigger signals in response to an event occurring during repetitive sections of said waveform;

sampling the waveform at a sampling time occurring at an end of a predetermined time interval following generation of each trigger signal;

converting each waveform sample into a representative digital quantity;

dividing each digital quantity by a selected amount; and computina a sum of said divided digital quantities to produce an average magnitude of the waveform at said sampling time.

6. The method of claim 5 further comprising the step of:

offsetting each waveform sample by an adjustable offset amount and amplifying each offset waveform sample by an adjustable gain amount prior to conversion to a representative digital quantity.

7. A method for digitizing a waveform having repetitive sections comprising the steps of:

generating a plurality of trigger signals in response to an event occurring during repetitive sections of said waveform;

sampling the waveform at a sampling time occurring at an end of a predetermined time interval following generation of each trigger signal;

converting each waveform sample into a representative digital quantity;

dividing each digital quantity by a selected amount;

computing a sum of said divided digital quantities to produce an average magnitude of the waveform at said sampling time; and offsetting each waveform sample by an adjustable offset amount and amplifying each offset waveform sample by an adjustable gain amount prior to conversion to a representative digital quantity, wherein said offset and gain amounts are determined according to the steps comprising:

sampling a first analog signal of a known magnitude to obtain a first analog sample;

offsetting said first analog sample by a known offset amount to produce a first offset analog sample;

amplifying the first offset analog sample by a known gain amount to produce a first, offset, amplified analog sample;

converting said first, offset, amplified analog sample to a representative first digital quantity;

modifying said known offset amount according to a difference between said representative first digital quantity and a first known digital quantity corresponding to said first analog signal;

sampling a second analog signal of a known magnitude to produce a second analog sample;

offsetting said second analog sample by said selected offset amount to produce a second, offset analog sample;

amplifying the second offset analog sample by said known gain amount to produce a second, offset, amplified analog sample;

converting the second offset, amplified second analog sample to a representative second digital quantity; and modifying said known gain amount according to a ratio of said representative second digital quantity to a second known digital quantity corresponding to said second analog signal.

* * * * *